（12）United States Patent
Yayla et al.

(10) Patent No.: US 9,966,937 B2
(45) Date of Patent: May 8, 2018

(54) FREQUENCY MULTIPLIERS

(71) Applicant: Marvell World Trade LTD., St. Michael (BB)

(72) Inventors: Mustafa Oguzhan Yayla, Santa Clara, CA (US); Xiang Gao, Fremont, CA (US); Li Lin, Saratoga, CA (US)

(73) Assignee: Marvell World Trade LTD., St. Michael (BB)

( * ) Notice: Subject to any disclaimer, the term of this patent is extended or adjusted under 35 U.S.C. 154(b) by 0 days. days.

(21) Appl. No.: 15/184,342

(22) Filed: Jun. 16, 2016

(65) Prior Publication Data

US 2016/0373094 A1   Dec. 22, 2016

Related U.S. Application Data

(60) Provisional application No. 62/180,728, filed on Jun. 17, 2015.

(51) Int. Cl.
*H03B 19/00* (2006.01)
*H03K 5/00* (2006.01)
*H03B 19/14* (2006.01)
*H03K 3/03* (2006.01)

(52) U.S. Cl.
CPC ......... *H03K 5/00006* (2013.01); *H03B 19/14* (2013.01); *H03K 3/0315* (2013.01); *H03B 2200/007* (2013.01); *H03B 2202/05* (2013.01)

(58) Field of Classification Search
None
See application file for complete search history.

(56) References Cited

U.S. PATENT DOCUMENTS

| 3,355,655 | A | 11/1967 | Burckhardt |
| 3,961,172 | A | 6/1976 | Hutcheon |
| 3,983,501 | A | 9/1976 | Lindstrum |
| 4,017,682 | A | 4/1977 | Tojo |
| 4,053,713 | A | 10/1977 | Nitadori |
| 4,642,490 | A | 2/1987 | Lawton |

(Continued)

FOREIGN PATENT DOCUMENTS

| EP | 1313210 A1 | 5/2003 |
| EP | 2360834 A2 | 8/2011 |

(Continued)

OTHER PUBLICATIONS

Puyal, V. et al., "A broad-band active frequency doubler operating up to 120 GHz," European Gallium Arsenide and Other Semiconductor Application Symposium, GAAS 2005 Oct. 3, 2005, Piscataway,NJ, USA, IEEE, Piscataway, NJ, USA, Oct. 3, 2005 (Oct. 3, 2005), pp. 557-560, XP031823431, ISBN: 978-88-902012-0-2.

Gray, Paul R. et al., "Analysis and design of analog integrated circuits," Jan. 1, 1993 (Jan. 1, 1990), Analysis and Design of Analog Integrated Circuits, New York, J.Wiley, US, pp. 593-598, XP002245777.

(Continued)

*Primary Examiner* — Cassandra Cox

(57) ABSTRACT

A system includes a signal generator and a signal combiner. The signal generator is configured to output a first signal having a first frequency and to output one or more signals having the first frequency and having phases shifted relative to the first signal by predetermined amounts. The signal combiner is configured to combine the first signal and the one or more signals to output a frequency multiplied second signal having a second frequency. The second frequency is greater than the first frequency.

16 Claims, 6 Drawing Sheets

(56) References Cited

U.S. PATENT DOCUMENTS

| | | | |
|---|---|---|---|
| 4,751,575 | A | 6/1988 | Noske |
| 5,034,703 | A | 7/1991 | Schumacher |
| 5,111,508 | A | 5/1992 | Gale et al. |
| 5,592,131 | A | 1/1997 | Labreche et al. |
| 5,774,788 | A | 6/1998 | Hannah et al. |
| 5,838,178 | A | 11/1998 | Marbot |
| 7,332,976 | B1 | 2/2008 | Brennan |
| 8,811,926 | B2 * | 8/2014 | Otis .......................... G06F 7/68 327/112 |
| 8,838,053 | B2 | 9/2014 | Lin et al. |
| 2002/0039039 | A1 * | 4/2002 | Maligeorgos .......... H03B 19/14 327/116 |
| 2002/0125924 | A1 | 9/2002 | Kurogouchi et al. |
| 2005/0245200 | A1 | 11/2005 | Kluge et al. |
| 2006/0144448 | A1 | 7/2006 | Goody |
| 2006/0246862 | A1 | 11/2006 | Agarwal et al. |
| 2007/0200641 | A1 | 8/2007 | Sen et al. |

FOREIGN PATENT DOCUMENTS

| | | |
|---|---|---|
| JP | H07129697 A | 5/1995 |
| JP | H087018 A | 1/1996 |
| JP | 2005117360 A | 4/2005 |
| JP | 2005136836 A | 5/2005 |

OTHER PUBLICATIONS

Notification of Transmittal of the International Search Report and the Written Opinion of the International Searching Authority, or the Declaration dated Oct. 16, 2012 in reference to PCT/US2012/034108 (17 pages).

Notification of Transmittal of The International Search Report and The Written Opinion of the International Searching Authority, or the Declaration dated Dec. 8, 2016 in reference to PCT/US2016/038055 (18 pages).

* cited by examiner

FREQUENCY MULTIPLIERS

CROSS-REFERENCE TO RELATED APPLICATIONS

This application claims the benefit of U.S. Provisional Application No. 62/180,728, filed on Jun. 17, 2015. The entire disclosure of the application referenced above is incorporated herein by reference.

This application is related to U.S. patent application Ser. No. 13/449,468, filed on Apr. 18, 2012 (now U.S. Pat. No. 8,838,053 issued on Sep. 16, 2014), which claims the benefit of U.S. Provisional Patent Application No. 61/480,947, filed on Apr. 29, 2011 and U.S. Provisional Patent Application No. 61/484,110, filed May 9, 2011. The entire disclosures of the applications and patent referenced above are incorporated herein by reference.

FIELD

The present disclosure relates generally to electronic circuits and more particularly to frequency multiplier circuits.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, a local oscillator (LO) generates a periodic signal, referred to as a clock, that is used in many electronic circuits including wireless transceivers, data converters, wireline and optical serial data communication links, processors, and memory circuits. A voltage-controlled oscillator (VCO) locked to a reference clock by a phase-locked loop (PLL) is often used to generate the clock on chip. In some circuits, however, the VCO output cannot be directly used as clock because some power may leak from a power amplifier to the VCO, and if the VCO and the power amplifier operate at similar frequencies, the VCO frequency may be pulled away from its center frequency towards the power amplifier frequency, which is referred to as power amplifier pulling. Further, clocks of different frequencies may be needed to support different communication standards in a single communication device. Accordingly, conventional clock generation schemes are insufficient for generating clocks at some of the required different frequencies.

SUMMARY

A system comprises a signal generator and a signal combiner. The signal generator is configured to output a first signal having a first frequency and to output one or more signals having the first frequency and having phases shifted relative to the first signal by predetermined amounts. The signal combiner is configured to combine the first signal and the one or more signals to output a frequency multiplied second signal having a second frequency. The second frequency is greater than the first frequency.

In other features, the one or more signals include a third signal and a fourth signal. The third signal has a phase shifted by 120 degrees relative to the first signal. The fourth signal has a phase shifted by 240 degrees relative to the first signal. The second frequency is three times the first frequency.

In other features, when N denotes a total number of signals including the first signal and the one or more signals, the signal combiner is configured to cancel the first frequencies of the first signal and the one or more signals; add an $N^{th}$ harmonic of the first signal and $N^{th}$ harmonics of the one or more signals in phase to output the second signal; and output the second signal having the second frequency equal to N times the first frequency.

In other features, the signal generator comprises a phase shifter including (N−1) delay circuits connected in series with each other. A first delay circuit of the (N−1) delay circuits receives the first signal. The (N−1) delay circuits respectively output the one or more signals. Each delay circuit of the (N−1) delay circuits shifts a phase of a respective input signal by (360/N) degrees.

In other features, the signal generator comprises an N-stage ring oscillator. A first stage of the N-stage ring oscillator outputs the first signal. Remaining (N−1) stages of the N-stage ring oscillator respectively output the one or more signals.

In other features, the system further comprises a frequency divider coupled to the signal combiner, the frequency divider configured to divide the second frequency of the second signal by 2.

In other features, the system further comprises a tank circuit connected to the signal combiner. The tank circuit configured to filter residual first frequency from the second signal.

In other features, the system further comprises a frequency divider and a tank circuit. The frequency divider is connected to the signal combiner to divide the second frequency of the second signal by 2. The tank circuit is connected to the frequency divider to filter residual first frequency from an output of the frequency divider.

A frequency divider a first tank circuit, a frequency divider, and a second tank circuit. The first tank circuit is coupled to the signal combiner. The first tank circuit is configured to filter the second signal and to output a filtered second signal. The frequency divider coupled to the signal combiner. The frequency divider is configured to divide the second frequency of the second signal by 2. The second tank circuit is coupled to the frequency divider. The second tank circuit is configured to filter an output of the frequency divider.

In still other features, a method comprises generating, using a signal generator, a first signal having a first frequency, and one or more signals having the first frequency and having phases shifted relative to the first signal by predetermined amounts. The method further comprises combining, using a signal combiner, the first signal and the one or more signals to output a frequency multiplied second signal having a second frequency. The second frequency is greater than the first frequency.

In other features, the one or more signals include a third signal and a fourth signal. The third signal has a phase shifted by 120 degrees relative to the first signal. The fourth signal has a phase shifted by 240 degrees relative to the first signal. The second frequency is three times the first frequency.

In other features, when N denotes a total number of signals including the first signal and the one or more signals, the combining the first signal and the one or more signals comprises canceling, using the signal combiner, the first frequencies of the first signal and the one or more signals;

adding, using the signal combiner, an $N^{th}$ harmonic of the first signal and $N^{th}$ harmonics of the one or more signals in phase to output the second signal; and outputting, using the signal combiner, the second signal having the second frequency equal to N times the first frequency.

In other features, the method further comprises dividing, using a frequency divider, the second frequency of the second signal by 2.

In other features, the method further comprises filtering, using a tank circuit, residual first frequency from the second signal.

In other features, the method further comprises dividing, using a frequency divider, the second frequency of the second signal by 2 to output a divided second signal; and filtering, using a tank circuit, residual first frequency from the divided second signal.

In other features, the method further comprises filtering, using a first tank circuit, the second signal to output a filtered second signal; dividing, using a frequency divider, the second frequency of the second signal by 2 to output a divided second signal; and filtering, using a second tank circuit, the divided second signal.

In still other features, a system comprises a ring oscillator and a signal combiner. The ring oscillator includes a plurality of stages and is configured to output a plurality of signals. Each signal of the plurality of signals has a first frequency. A first signal of the plurality of signals output by a first stage of the plurality of stages has a first a phase. Remaining signals of the plurality of signals output respectively by remaining stages of the plurality of stages have phases shifted relative to the first phase by predetermined amounts. The signal combiner is configured to combine the plurality of signals to output a frequency multiplied second signal having a second frequency. The second frequency is greater than the first frequency.

In still other features, when N denotes a total number of the plurality of signals, the signal combiner is configured to cancel the first frequencies of the plurality of signals; add $N^{th}$ harmonics of the plurality of signals in phase to output the second signal; and output the second signal having the second frequency equal to N times the first frequency.

In still other features, the system further comprises a frequency divider coupled to the signal combiner, the frequency divider configured to divide the second frequency of the second signal by 2.

In still other features, the system further comprises a tank circuit coupled to the signal combiner, the tank circuit configured to filter the second signal.

In other features, the system further comprises a frequency divider and a tank circuit. The frequency divider is coupled to the signal combiner. The frequency divider is configured to divide the second frequency of the second signal by 2. The tank circuit is coupled to the frequency divider. The tank circuit is configured to filter an output of the frequency divider.

In other features, the system further comprises a first tank circuit, a frequency divider, and a second tank circuit. The first tank circuit is coupled to the signal combiner. The first tank circuit is configured to filter the second signal and to output a filtered second signal. The frequency divider is coupled to the signal combiner. The frequency divider is configured to divide the second frequency of the second signal by 2. The second tank circuit is coupled to the frequency divider. The second tank circuit is configured to filter an output of the frequency divider.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
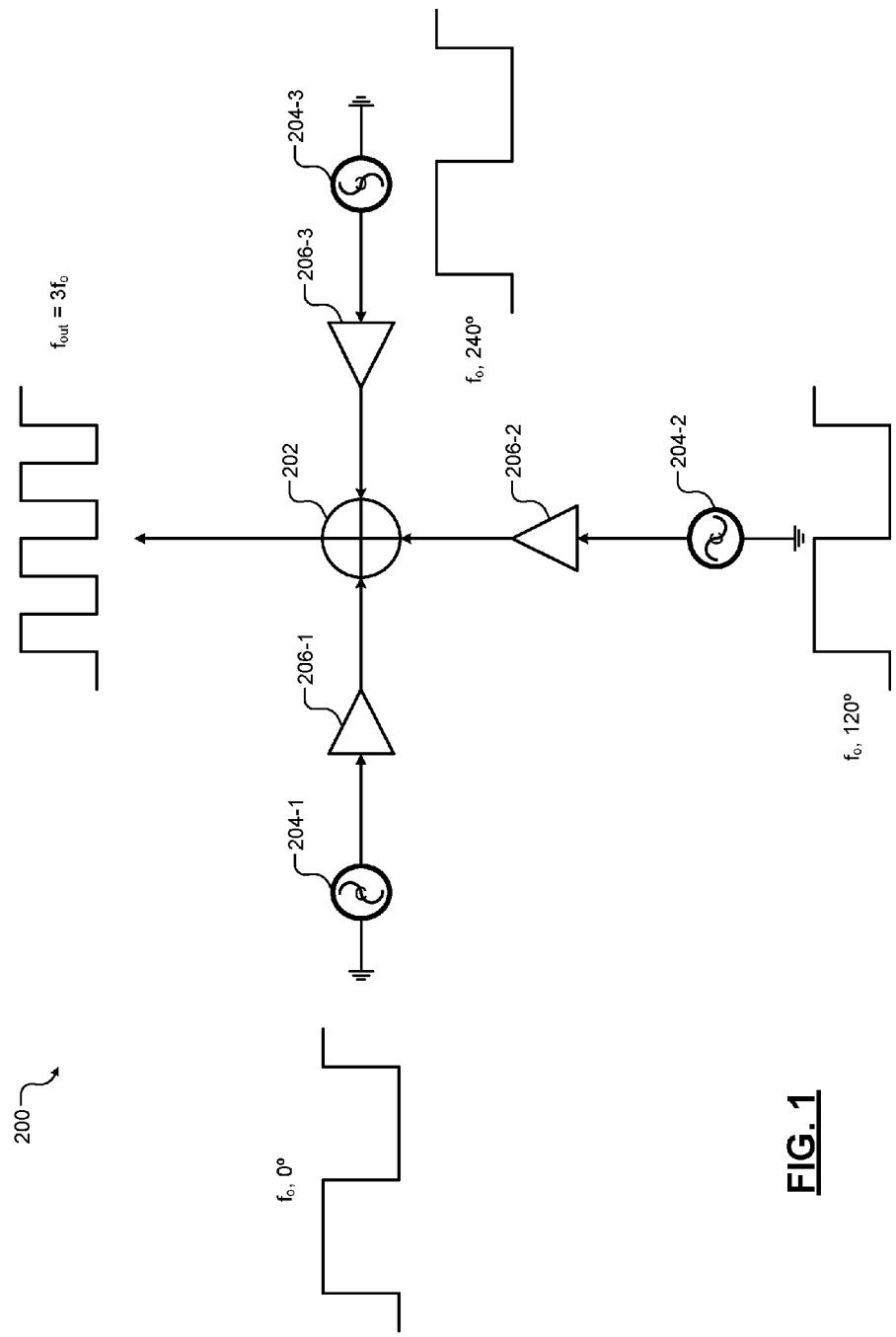
FIG. 1 is a schematic of an example of a frequency multiplier circuit according to an embodiment of the present disclosure.

A voltage-controlled oscillator (VCO) locked to a reference clock by a phase-locked loop (PLL) is used to generate a clock on a chip. Some power may leak from a power amplifier on the chip to the VCO, and if the VCO and the power amplifier operate at similar frequencies, the VCO frequency may be pulled away from its center frequency towards the power amplifier frequency, which is referred to as power amplifier pulling. A phase-locked loop (PLL) uses frequency mixing and frequency division due to power amplifier pulling. Therefore, efficient ways are required to change voltage-controlled oscillator (VCO) clock frequencies to support circuits that require clocks of different frequencies (e.g., devices compliant with different communication standards). Typically divide-by-2 and multiply-by-3 circuits are used for this purpose.

The present disclosure proposes embodiments that use three clock signals having the same predetermined frequency but having phases shifted by 120 degrees from each other to generate a strong third order harmonic having a frequency that is triple that of the predetermined input frequency.

In the proposed embodiments and techniques, by combining signals with predetermined phases and a fundamental input frequency (e.g., three clock signals having the same predetermined frequency but having phases shifted by 120 degrees from each other), higher order in-phase harmonics are generated with a minimum level of unwanted frequencies at the final output. For example, to generate a third order harmonic having a frequency three times a fundamental frequency of an input signal, three clock signals each having the fundamental frequency and respectively having 0 degree, 120 degree, and 240 degree phases are combined. The fundamental frequencies of the three clock signals cancel each other, and third order harmonics of each of the three clock signals are combined in-phase to provide a signal having three times the fundamental frequency. This technique is extendible to other harmonics as well. For example, the technique is applicable to other harmonics such as fifth harmonics, seventh harmonics, and so on, to obtain different multiplication factors.

The above inventive technique can be generalized as follows. In general, to generate an output signal having N times a fundamental frequency of an input signal, where N is an integer greater than 1, N signals are combined as follows. A first signal of the N signals is the input signal itself having the fundamental frequency. Second through $N^{th}$ signals each have the same fundamental frequency as the input signal but each has a phase shifted by 360 degrees divided by N. When the N signals are combined, the fundamental frequencies of the N signals cancel out, and $N^{th}$ harmonics of the N signals that are added in-phase provide a signal having N times the fundamental frequency.

Also, in various embodiments of the invention, other circuits are stacked on top of the proposed frequency multiplier circuits. While not shown, examples of such circuits include an LC tank circuit for noise rejection, and a divide-by-2 circuit to achieve fractional multipliers (e.g., with N=3, 3/2=multiply-by-1.5; with N=5, 5/2=multiply-by-2.5; and so on).

Throughout the present disclosure, frequency tripling is described by way of example only. The teachings of the present disclosure are applicable to multiply a fundamental frequency by any multiplier. Further, throughout the present disclosure, odd multipliers (e.g., 3×, 5×, 7×, and so on) are used because square wave clocks generally have stronger odd harmonics than even harmonics. Ideally, there are no even harmonics. Therefore, while the teachings of the present disclosure are discussed with references to odd multipliers, the teachings are also useful for even multipliers (e.g., 2×, 4×, 6×, and so on) if the main clock generated by a signal generator (e.g., a VCO) has even harmonics, for instance due to some nonlinearities.

FIG. 1 schematically shows an example of a frequency tripler 200 according to the present disclosure. The frequency tripler 200 comprises a signal combiner 202 that combines three signals 204-1, 204-2, and 204-3 that are respectively buffered by buffers 206-1, 206-2, and 206-3. Each of the three signals has the same fundamental frequency $f_o$. The three signals respectively have phases of 0 degrees, 120 degrees, and 240 degrees. When the signal combiner 202 combines the three signals, the fundamental frequencies of the three signals cancel out, and $3^{rd}$ order harmonics of the three signals are added together in-phase to provide an output signal having three times the fundamental frequency. Accordingly, the signal combiner 202 generates the output signal having a frequency $f_{out}=3*f_o$.

Figure 2A:
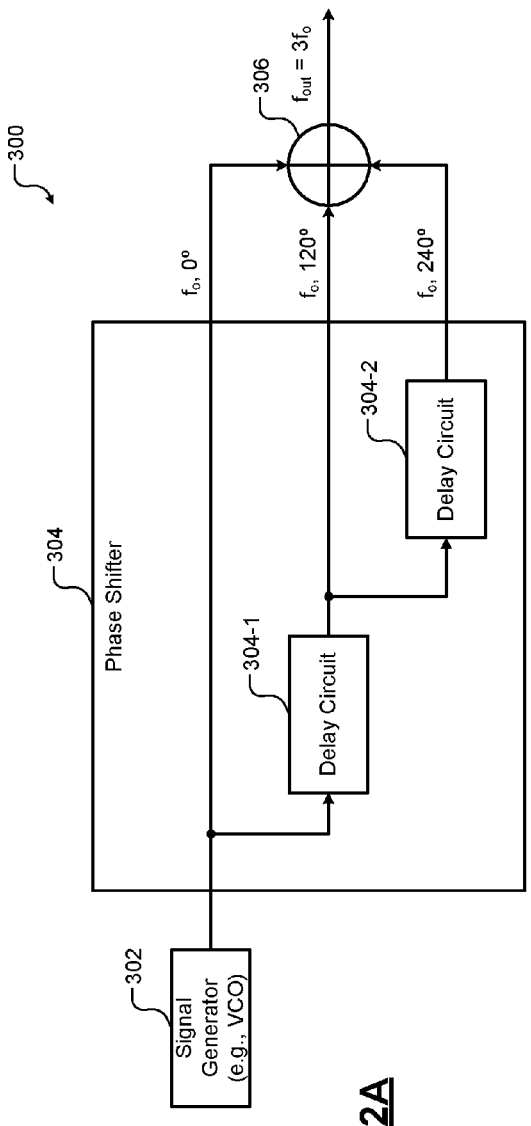
FIG. 2A is a functional block diagram of an example implementation of the frequency multiplier circuit of FIG. 1 according to an embodiment of the present disclosure.

FIG. 2A shows a functional block diagram of an example of a frequency tripler 300 according to the present disclosure. The frequency tripler 300 comprises a signal generator 302, a phase shifter 304, and a signal combiner 306 that in an embodiment are coupled together as seen in FIG. 2A. The signal generator 302 generates a first signal having a fundamental frequency $f_o$ and a phase of 0°. For example, while not necessary, the signal generator 302 may include a VCO. The phase shifter 304 comprises a delay circuit 304-1 and a delay circuit 304-2. The delay circuit 304-1 delays the phase of the first signal by 120° and outputs a second signal having the fundamental frequency $f_o$ and a phase of 120°. Accordingly, the phase of the second signal is shifted by 120° relative to the phase of the first signal. The delay circuit 304-2 delays the phase of the second signal by an additional 120° and outputs a third signal having the fundamental frequency $f_o$ and a phase of 240°. Accordingly, the phase of the third signal is shifter by 120° relative to the phase of the second signal and by 240° relative to the phase of the first signal.

Each delay circuit outputs only one signal having the same fundamental frequency as its input signal and having a phase shifted by 120° relative to the phase of its input signal. When the signal combiner 306 combines the three signals output by the signal generator 302 and the two delay circuits 304-1 and 304-2, the fundamental frequencies of the three signals cancel each other out, and $3^{rd}$ harmonics of the three signals are added together in-phase to provide an output signal having three times the fundamental frequency. Accordingly, the signal combiner 306 combines the first, second, and third signals output by the signal generator 302 and the two delay circuits 304-1 and 304-2, each having the same fundamental frequency and with phases of the second and third signals shifted respectively by 120° and 240° relative to the phase of the first signal, and generates the output signal having a frequency $f_{out}=3*f_o$.

The above inventive technique can be generalized as follows. In general, a multiply-by-N circuit will include (N−1) delay circuits (e.g., a multiply-by-3 circuit will include 2 delay circuits as described above), each delaying its input by 360/N degrees, where N is an integer greater than or equal to 3. A first delay circuit of the (N−1) delay circuits will delay the output of the signal generator 302 by 360/N degrees. A second delay circuit of the (N−1) delay circuits will delay the output of the first delay circuit by 360/N degrees. A third delay circuit of the (N−1) delay circuits will delay the output of the second delay circuit by 360/N degrees, and so on.

Each delay circuit outputs only one signal having the same fundamental frequency as its input signal and having a phase shifted by 360/N degrees relative to the phase of its input signal. When the signal combiner 306 combines the output signal of the signal generator 302 and the output signals of the (N−1) delay circuits, the fundamental frequencies of the output signal of the signal generator 302 and the output signals of the (N−1) delay circuits cancel each other out, and $N^{th}$ harmonics of the output signal of the signal generator 302 and the output signals of the (N−1) delay circuits are added together in-phase to provide an output signal having N times the fundamental frequency. In other words, the signal combiner 306 combines the output signal of the signal generator 302 and the output signals of the (N−1) delay circuits and generates the output signal having a frequency $f_{out}=N*f_o$.

Note that each delay circuit 304-1, 304-2 shifts the phase of respective input signals by the same amount. Therefore, cascading identical delay circuits 304-1, 304-2 is used as shown in FIG. 2A. Alternatively, if delay circuits are connected in parallel, each receiving the same input signal, and each being capable of providing different amounts of phase shifts (e.g., 120 degrees and 240 degrees in the above example), the outputs of the delay circuits are combined with the input signal having a phase shift of zero degrees to achieve the same result as that shown and described above with reference to FIG. 2A. It is possible to generalize the inventive embodiment involving parallel delay circuits similar to the generalization mentioned above with reference to the cascaded delay circuits.

In some implementations, the phase shifter is eliminated by using a multi-stage ring oscillator as the signal generator, where each stage of the multi-stage ring oscillator adds a delay, and therefore output of each stage of the multi-stage ring oscillator is phase shifted relative to an adjacent stage.

Figure 2B:
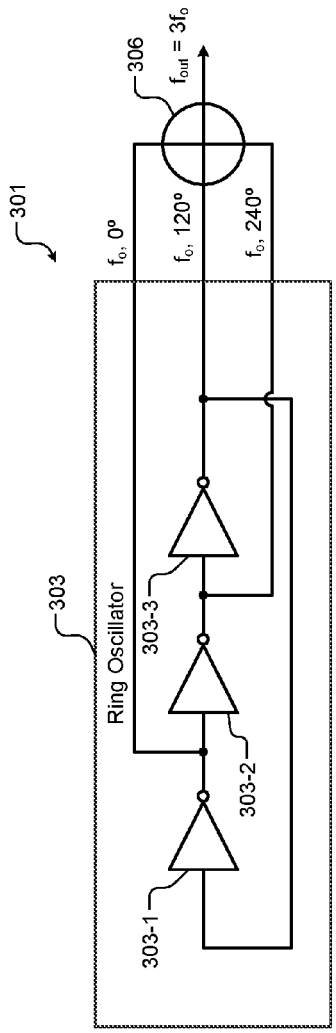
FIG. 2B is a functional block diagram of an example implementation of the frequency multiplier circuit of FIG. 1 according to an embodiment of the present disclosure.

FIG. 2B shows a functional block diagram of an example of a frequency tripler 301 according to the present disclosure that uses a ring oscillator 303 instead of the signal generator 302 and the phase shifter 304. The frequency tripler 301 comprises the ring oscillator 303 and the signal combiner 306. The ring oscillator 303 in the example shown is a three-stage ring oscillator. The ring oscillator 303 includes three stages or three inverters 303-1, 303-2, and 303-3. While not shown, the ring oscillator 303 can be implemented using other suitable logic gates, combinational and/or sequential logic circuits, discrete components such as transistors, or any combination thereof.

The first stage or the first inverter 303-1 generates a first signal having a fundamental frequency $f_o$ and a phase of 0°. The second stage or the second inverter 303-2 delays the phase of the first signal by 120° and outputs a second signal having the fundamental frequency $f_o$ and a phase of 120°. The third stage or the inverter gate 303-3 delays the phase of the second signal by 120° and outputs a third signal having the fundamental frequency $f_o$ and a phase of 240°.

When the signal combiner 306 combines the three signals output by the three stages of the ring oscillator 303, each having the same fundamental frequency of the signal generated by the first stage of the ring oscillator 303, the fundamental frequencies of the three signals cancel each other out, and $3^{rd}$ harmonics of the three signals are added together in-phase to provide an output signal having three times the fundamental frequency. Accordingly, the signal combiner 306 combines the first, second, and third signals output by the three stages and generates the output signal having a frequency $f_{out}=3*f_o$.

The above inventive technique using the ring oscillator can be generalized as follows. In general, a multiply-by-N circuit will include an N-stage ring oscillator, where N is an integer greater than or equal to 3. When the signal combiner 306 combines the output signals of each stage of the N-stage ring oscillator, each having the same fundamental frequency of the signal output by the first stage of the N-stage ring oscillator, the fundamental frequencies of the output signals of the N stages cancel each other out, and $N^{th}$ harmonics of the output signals of the N stages are added together in-phase to provide an output signal having N times the fundamental frequency. In other words, the signal combiner 306 combines the output signals of the N stages of the N-stage ring oscillator and generates the output signal having a frequency $f_{out}=N*f_o$.

In the inventive circuits disclosed herein, if the phases of the signals that are combined are not as specified (e.g., 0, 120, and 240 degrees in case of a frequency tripler), that is, if there is any phase error/mismatch, the output of the combiner will include a residual fundamental frequency referred to herein as spur.

Figure 3:
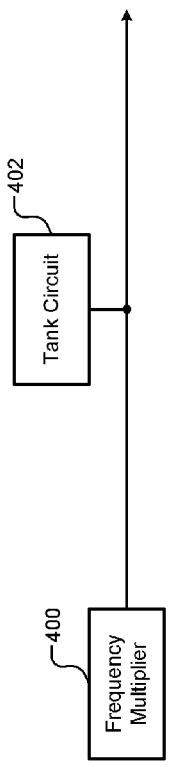
FIG. 3 shows an arrangement of the frequency multiplier circuit of FIG. 1 and a tank circuit according to an embodiment of the present disclosure.
Figure 4:
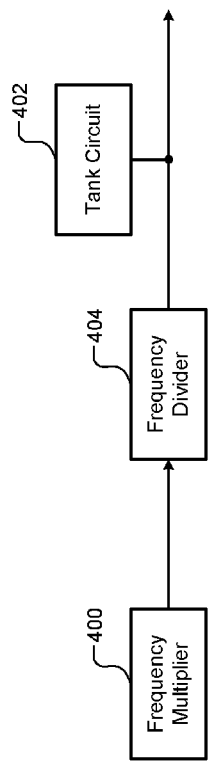
FIG. 4 shows an arrangement of the frequency multiplier circuit of FIG. 1, a frequency divider, and a tank circuit according to an embodiment of the present disclosure.
Figure 5:
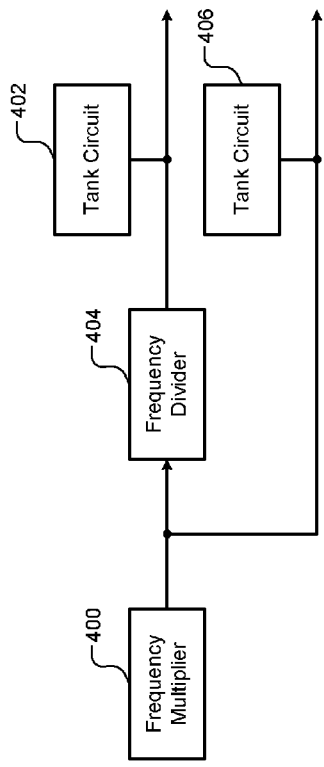
FIG. 5 shows an arrangement of the frequency multiplier circuit of FIG. 1, a frequency divider, and a plurality of tank circuits according to an embodiment of the present disclosure.

FIGS. 3-5 show examples of additional circuits that are stacked on top of the proposed frequency multiplier circuits (e.g., the frequency triplers 300, 301) according to an embodiment of the present disclosure. For example, FIG. 3 shows a frequency multiplier 400 and a tank circuit 402 to reject any spur in the output of the frequency multiplier 400. For example, the frequency multiplier 400 includes the frequency tripler 300, the frequency tripler 301, or a multiply-by-N circuit, where, for example, N=5, 7, etc. The tank circuit 402 is stacked on top of the frequency multiplier 400 for spur rejection.

For example, FIG. 4 shows a frequency divider 404 and optionally the tank circuit 402 are stacked on top of the frequency multiplier 400. The frequency divider 404 divides the frequency of the output signal of the frequency multiplier 400. For example, if the frequency multiplier 400 includes the frequency tripler 300, the frequency divider 404 generates an output signal having a frequency of $1.5*f_o$; if the frequency multiplier 400 includes a multiply-by-5 circuit, the frequency divider 404 generates an output signal having a frequency of $2.5*f_o$; and so on. The tank circuit 402 is stacked for spur rejection from the output signal of the frequency divider 404.

For example, FIG. 5 shows a frequency divider 404 and two tank circuits 402, 406 are stacked on top of the frequency multiplier 400. The frequency divider 404 divides the frequency of the output signal of the frequency multiplier 400. The tank circuit 402 is stacked for spur rejection from the output signal of the frequency divider 404. The tank circuit 406 is stacked for spur rejection from the output signal of the frequency multiplier 400.

Figure 6:
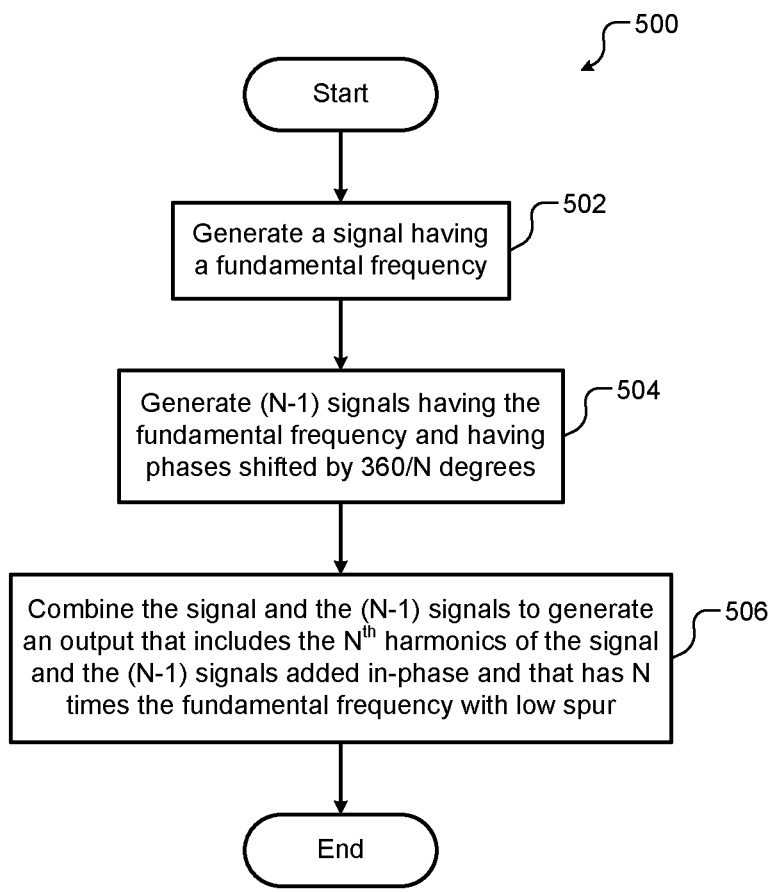
FIG. 6 shows a flowchart of a method for multiplying frequency of an input signal using the frequency multiplier circuit of FIG. 1 according to an embodiment of the present disclosure.

FIG. 6 is a flow chart illustrating a method 500 for multiplying the frequency of an input signal according to the present disclosure. At 502, control generates a signal having a fundamental frequency $f_o$ and a phase of 0°. At 504, control generates (N−1) signals having the fundamental frequency $f_o$ and having phases shifted by 360/N degrees, where N is an integer greater than or equal to 3. At 506, control combines the signal having the fundamental frequency $f_o$ and a phase of 0°, and the (N−1) signals having the fundamental frequency $f_o$ and having phases shifted by 360/N degrees. The fundamental frequencies of the signal and the (N−1) signals cancel out, the $N^{th}$ harmonics of the signal and the (N−1) signals are added in-phase, and control generates an output signal having a frequency N times the fundamental frequency $f_o$ (i.e., $N*f_o$)

Figure 7:
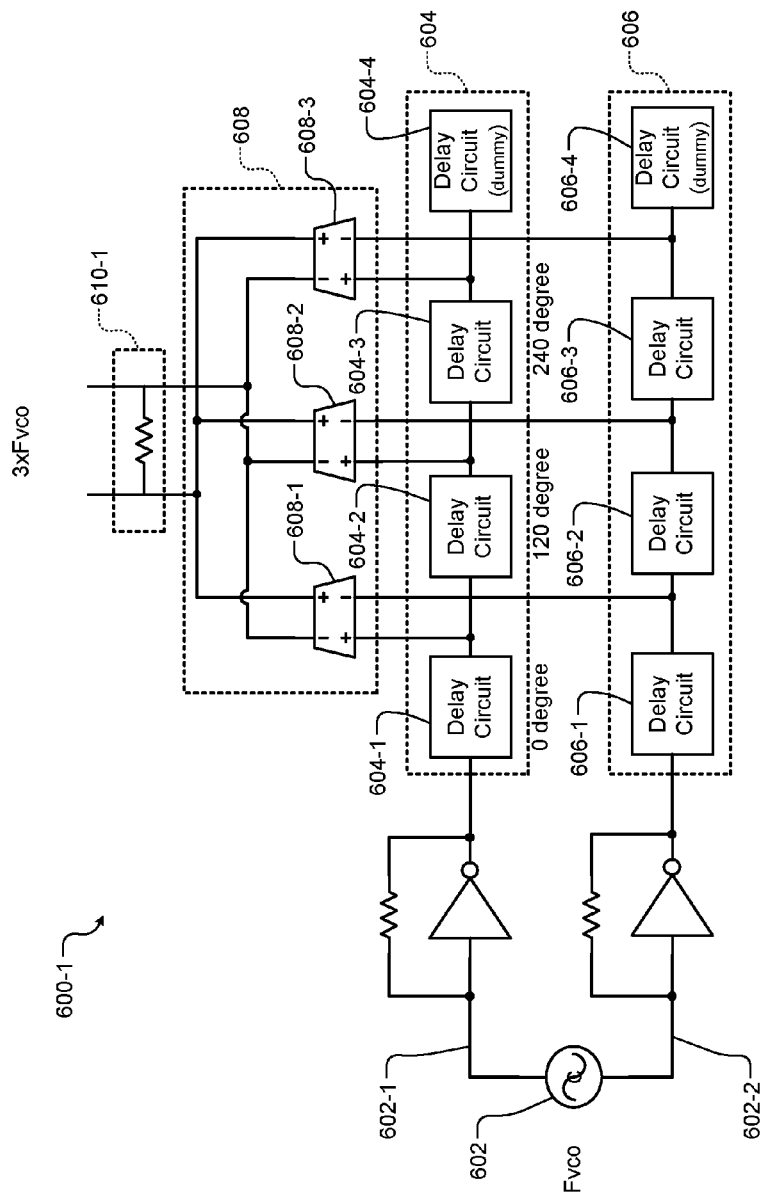
FIG. 7 is a functional block diagram of an example of a differential implementation of the frequency multiplier circuit of FIG. 1 with a resistive load according to an embodiment of the present disclosure.
Figure 8:
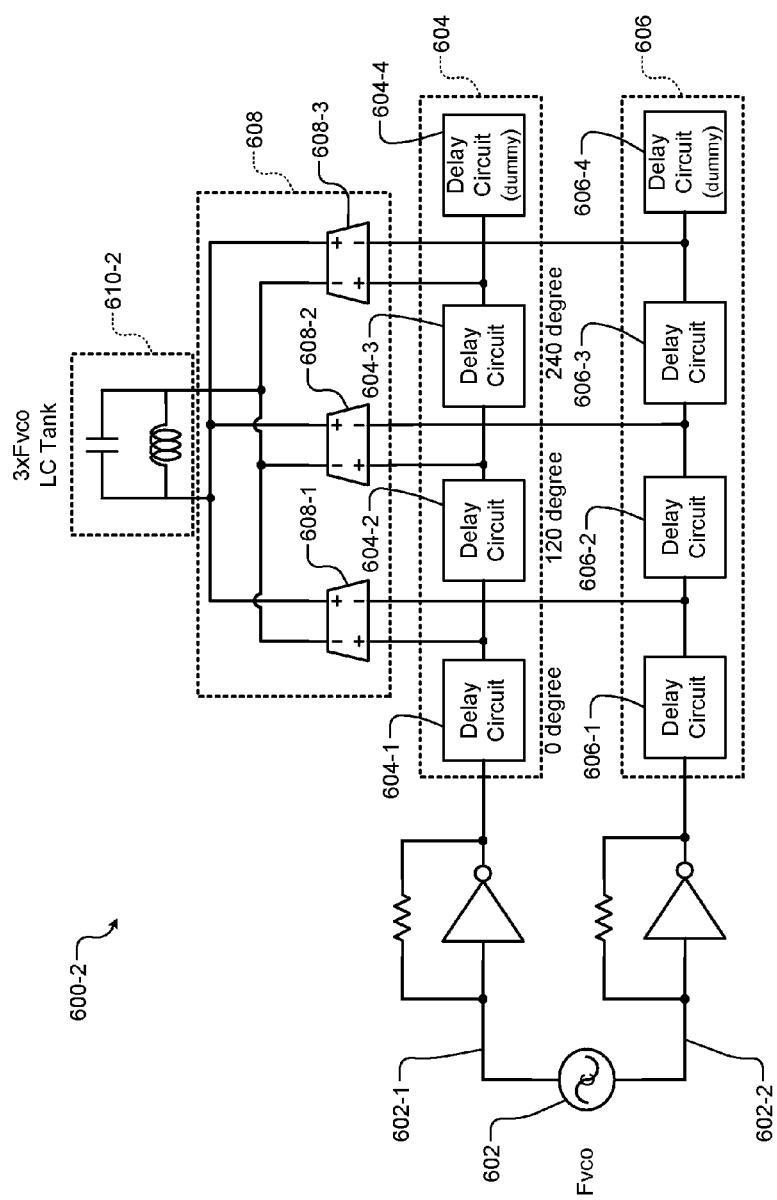
FIG. 8 is a functional block diagram of an example of a differential implementation of the frequency multiplier circuit of FIG. 1 with a tank circuit as load according to an embodiment of the present disclosure.

FIGS. 7 and 8 show examples of differential frequency multipliers 600-1 and 600-2 according to the present disclosure. In these implementations, both VCO outputs (e.g., both outputs 602-1, 602-2 of a signal generator 602 employing a VCO) are used and are respectively delayed by two different sets of delay circuits for differential implementation. While two sets of delay circuits are shown, however, only one set of delay circuits is used in some differential implementations.

The differential frequency multipliers 600-1 and 600-2 are shown with different loads. The differential frequency multiplier 600-1 shown in FIG. 7 has a resistive load 610-1. The differential frequency multiplier 600-2 shown in FIG. 8 has a tank circuit 610-2 as a load. The tank circuit 610-2 provides rejection of frequency components that may be present due to circuit mismatch and process variation, for example. Other than different loads, the differential frequency multipliers 600-1 and 600-2 are similar in structure. Therefore, the following discussion applies to both the differential frequency multipliers 600-1 and 600-2 except where noted otherwise.

In FIGS. 7 and 8, a first VCO output 602-1 of the signal generator 602 is delayed by a first set of delay circuits 604, and a second VCO output 602-1 of the signal generator 602 is delayed by a second set of delay circuits 606. Output signals of the first and second sets of delay circuits 604, 606 are combined by a signal combiner 608 to generate a differential output signal having a frequency equal to a multiple of the VCO frequency (e.g., $3*F_{VCO}$).

By way of example only, the differential frequency multipliers 600-1 and 600-2 are shown as differential frequency triplers. Other frequency multipliers (e.g., multiply-by-5, multiply-by-7, and so on) are contemplated. Further, frequency dividers are used to divide each differential output of the differential frequency multipliers 600-1 and 600-2. For example, each frequency divider includes a divide-by-2 circuit to achieve fractional multipliers (e.g., multiply-by-1.5 if the multiplier circuit is a tripler circuit; multiply-by-2.5 if the multiplier circuit is a multiply-by-7 circuit; and so on). Further, in FIGS. 3-5, the frequency multiplier 400 includes one of the differential frequency multipliers 600-1 and 600-2.

In the examples of the differential frequency triplers 600-1 and 600-2 shown in FIGS. 7 and 8, each of the first and second sets of delay circuits 604, 606 comprises four delay circuits. The first set of delay circuits 604 comprises delay circuits 604-1, 604-2, 604-3, and 604-4. The second set of delay circuits 606 comprises delay circuits 606-1, 606-2, 606-3, and 606-4.

In the first set of delay circuits 604, the first delay circuit 604-1 receives the first VCO signal 602-1. The second delay circuit 604-2 receives the output of the first delay circuit 604-1. The third delay circuit 604-3 receives the output of the second delay circuit 604-2. The fourth delay circuit 604-4 receives the output of the third delay circuit 604-3.

In the second set of delay circuits 606, the first delay circuit 606-1 receives the second VCO signal 602-2. The second delay circuit 606-2 receives the output of the first delay circuit 606-1. The third delay circuit 606-3 receives the output of the second delay circuit 606-2. The fourth delay circuit 606-4 receives the output of the third delay circuit 606-3.

In each of the first and second sets of delay circuits 604, 606, each of the delay circuits, except the first and the last delay circuits, shifts the phase of the respective input signals by the same amount (360/N). For example, in the first set of delay circuits 604, the delay circuits 604-2, 604-3 shift the phase of the respective input signals by the same amount (e.g., 120 degrees in this example); and in the second set of delay circuits 606, the delay circuits 606-2, 606-3 shift the phase of the respective input signals by the same amount (e.g., 120 degrees in this example). The first and the last delay circuits 604-1, 604-4, 606-1, 606-4 in the first and the second sets of delay circuits 604, 606 do not shift the phases of their respective input signals.

The signal combiner 608 of each of the differential frequency triplers 600-1, 600-2 comprises three signal combiner circuits 608-1, 608-2, and 608-3. The signal combiner circuit 608-1 combines the outputs of the delay circuits 604-1 and 606-1. The signal combiner circuit 608-2 combines the outputs of the delay circuits 604-2 and 606-2. The signal combiner circuit 608-3 combines the outputs of the delay circuits 604-3 and 606-3.

Each of the three signal combiners 608-1, 608-2, and 608-3 outputs respective differential output signals (first and second outputs) having first and second polarities (shown as − and +), respectively. The first outputs of the signal combiner circuits 608-1, 608-2, and 608-3 having the first polarity (e.g., shown as −) are output to a first input of a load (shown as a resistive load 610-1 in FIG. 7 and as a tank circuit 610-2 in FIG. 8), and the second outputs of the signal combiner circuits 608-1, 608-2, and 608-3 having the second polarity (e.g., shown as +) are output to a second input of the load. The differential output signal across the load has a frequency equal to a multiple of the VCO frequency (e.g., $3*F_{VCO}$).

In some implementations, while not shown, the signal generator 602 and the delay circuits 604, 606 shown in FIGS. 7 and 8 are replaced by differential ring oscillators.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A system comprising:
   a signal generator configured to output a first signal having a first frequency and to output one or more signals having the first frequency and having phases shifted relative to the first signal by predetermined amounts;
   a signal combiner configured to combine the first signal and the one or more signals to output a frequency multiplied second signal having a second frequency, wherein the second frequency is greater than the first frequency, and
   wherein when N denotes a total number of signals including the first signal and the one or more signals, the signal combiner configured to:
     cancel the first frequencies of the first signal and the one or more signals;
     add an $N^{th}$ harmonic of the first signal and $N^{th}$ harmonics of the one or more signals in phase to output the second signal; and
     output the second signal having the second frequency equal to N times the first frequency; and
   a frequency divider coupled to the signal combiner, the frequency divider configured to divide the second frequency of the second signal by 2.

2. The system of claim 1, wherein:
   the one or more signals include a third signal and a fourth signal;
   the third signal has a phase shifted by 120 degrees relative to the first signal;
   the fourth signal has a phase shifted by 240 degrees relative to the first signal; and
   the second frequency is three times the first frequency.

3. The system of claim 1, wherein the signal generator comprises a phase shifter including (N−1) delay circuits connected in series with each other, wherein:
   a first delay circuit of the (N−1) delay circuits receives the first signal;
   the (N−1) delay circuits respectively output the one or more signals; and
   each delay circuit of the (N−1) delay circuits shifts a phase of a respective input signal by (360/N) degrees.

4. The system of claim 1, wherein the signal generator comprises an N-stage ring oscillator, wherein:
   a first stage of the N-stage ring oscillator outputs the first signal; and
   remaining (N−1) stages of the N-stage ring oscillator respectively output the one or more signals.

5. The system of claim 1, further comprising:
   a first tank circuit coupled to the signal combiner, the first tank circuit configured to filter the second signal and to output a filtered second signal; and a second tank circuit coupled to the frequency divider, the second tank circuit configured to filter an output of the frequency divider.

6. A system comprising:
a signal generator configured to output a first signal having a first frequency and to output one or more signals having the first frequency and having phases shifted relative to the first signal by predetermined amounts;
a signal combiner configured to combine the first signal and the one or more signals to output a frequency multiplied second signal having a second frequency, wherein the second frequency is greater than the first frequency; and
a tank circuit connected to the signal combiner, the tank circuit configured to filter residual first frequency from the second signal.

7. A system comprising:
a signal generator configured to output a first signal having a first frequency and to output one or more signals having the first frequency and having phases shifted relative to the first signal by predetermined amounts;
a signal combiner configured to combine the first signal and the one or more signals to output a frequency multiplied second signal having a second frequency, wherein the second frequency is greater than the first frequency;
a frequency divider connected to the signal combiner to divide the second frequency of the second signal by 2; and
a tank circuit connected to the frequency divider to filter residual first frequency from an output of the frequency divider.

8. A method comprising:
generating, using a signal generator, a first signal having a first frequency;
generating, using the signal generator, one or more signals having the first frequency and having phases shifted relative to the first signal by predetermined amounts;
combining, using a signal combiner, the first signal and the one or more signals to output a frequency multiplied second signal having a second frequency, wherein the second frequency is greater than the first frequency;
dividing, using a frequency divider, the second frequency of the second signal by 2 to output a divided second signal; and
filtering, using a tank circuit, residual first frequency from the divided second signal.

9. The method of claim 8, wherein:
the one or more signals include a third signal and a fourth signal;
the third signal has a phase shifted by 120 degrees relative to the first signal;
the fourth signal has a phase shifted by 240 degrees relative to the first signal; and
the second frequency is three times the first frequency.

10. The method of claim 8, wherein when N denotes a total number of signals including the first signal and the one or more signals, the combining the first signal and the one or more signals comprises:
canceling, using the signal combiner, the first frequencies of the first signal and the one or more signals;
adding, using the signal combiner, an $N^{th}$ harmonic of the first signal and $N^{th}$ harmonics of the one or more signals in phase to output the second signal; and outputting, using the signal combiner, the second signal having the second frequency equal to N times the first frequency.

11. The method of claim 8, further comprising:
filtering, using a second tank circuit, the divided second signal.

12. A method comprising:
generating, using a signal generator, a first signal having a first frequency;
generating, using the signal generator, one or more signals having the first frequency and having phases shifted relative to the first signal by predetermined amounts;
combining, using a signal combiner, the first signal and the one or more signals to output a frequency multiplied second signal having a second frequency, wherein the second frequency is greater than the first frequency; and
filtering, using a tank circuit, residual first frequency from the second signal.

13. A system comprising:
a ring oscillator including a plurality of stages and configured to output a plurality of signals, wherein each signal of the plurality of signals has a first frequency, a first signal of the plurality of signals output by a first stage of the plurality of stages has a first a phase, and wherein remaining signals of the plurality of signals output respectively by remaining stages of the plurality of stages have phases shifted relative to the first phase by predetermined amounts;
a signal combiner configured to combine the plurality of signals to output a frequency multiplied second signal having a second frequency, wherein the second frequency is greater than the first frequency, and
wherein when N denotes a total number of the plurality of signals, the signal combiner configured to:
cancel the first frequencies of the plurality of signals;
add $N^{th}$ harmonics of the plurality of signals in phase to output the second signal; and
output the second signal having the second frequency equal to N times the first frequency; and
a frequency divider coupled to the signal combiner, the frequency divider configured to divide the second frequency of the second signal by 2.

14. The system of claim 13, further comprising:
a tank circuit coupled to the frequency divider, the tank circuit configured to filter an output of the frequency divider.

15. The system of claim 13, further comprising:
a first tank circuit coupled to the signal combiner, the first tank circuit configured to filter the second signal and to output a filtered second signal; and
a second tank circuit coupled to the frequency divider, the second tank circuit configured to filter an output of the frequency divider.

16. A system comprising:
a ring oscillator including a plurality of stages and configured to output a plurality of signals, wherein each signal of the plurality of signals has a first frequency, a first signal of the plurality of signals output by a first stage of the plurality of stages has a first a phase, and wherein remaining signals of the plurality of signals output respectively by remaining stages of the plurality of stages have phases shifted relative to the first phase by predetermined amounts;
a signal combiner configured to combine the plurality of signals to output a frequency multiplied second signal having a second frequency, wherein the second frequency is greater than the first frequency; and a tank circuit coupled to the signal combiner, the tank circuit configured to filter the second signal.

\* \* \* \* \*